(12) United States Patent
Liu et al.

(10) Patent No.: US 8,576,026 B2
(45) Date of Patent: Nov. 5, 2013

(54) SEMICONDUCTOR DEVICE HAVING BALANCED BAND-PASS FILTER IMPLEMENTED WITH LC RESONATOR

(75) Inventors: Kai Liu, Phoenix, AZ (US); Robert C. Frye, Piscataway, NJ (US); Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 872 days.

(21) Appl. No.: 12/331,492

(22) Filed: Dec. 10, 2008

(65) Prior Publication Data

US 2009/0167455 A1 Jul. 2, 2009

Related U.S. Application Data

(60) Provisional application No. 61/017,360, filed on Dec. 28, 2007.

(51) Int. Cl.
*H01P 3/08* (2006.01)
*H01P 7/08* (2006.01)

(52) U.S. Cl.
USPC .......................................... 333/204; 333/219

(58) Field of Classification Search
USPC .............. 333/175, 25, 26, 177, 185, 204, 219
See application file for complete search history.

(56) References Cited

U.S. PATENT DOCUMENTS

| | | | | |
|---|---|---|---|---|
| 4,894,629 A | * | 1/1990 | Okamura et al. | 333/177 |
| 5,055,809 A | * | 10/1991 | Sagawa et al. | 333/219 |
| 5,164,690 A | * | 11/1992 | Yeh et al. | 333/204 |
| 5,351,020 A | * | 9/1994 | Okamura et al. | 333/175 |
| 5,361,050 A | * | 11/1994 | Einbinder | 333/204 |
| 5,420,551 A | * | 5/1995 | Conte et al. | 333/12 |
| 5,477,204 A | | 12/1995 | Li | |
| 5,781,081 A | * | 7/1998 | Arakawa et al. | 333/185 |
| 6,762,655 B2 | * | 7/2004 | Wichern | 333/175 |
| 6,803,835 B2 | | 10/2004 | Frank | |
| 6,940,365 B2 | * | 9/2005 | Kamata et al. | 333/175 |
| 7,199,684 B2 | | 4/2007 | Aigner et al. | |
| 7,256,663 B2 | | 8/2007 | Yasuda et al. | |
| 7,508,280 B2 | * | 3/2009 | Gabara | 331/181 |
| 7,626,472 B2 | * | 12/2009 | Davies-Venn et al. | 333/26 |
| 7,755,464 B2 | * | 7/2010 | Hisamitsu | 336/200 |
| 7,825,746 B2 | * | 11/2010 | Yeung et al. | 333/185 |

* cited by examiner

*Primary Examiner* — Dean O Takaoka
*Assistant Examiner* — Alan Wong
(74) *Attorney, Agent, or Firm* — Robert D. Atkins; Patent Law Group: Atkins & Associates, P.C.

(57) ABSTRACT

A band-pass filter has a plurality of frequency band channels each including a first inductor having a first terminal coupled to a first balanced port and a second terminal coupled to a second balanced port. A first capacitor is coupled between the first and second terminals of the first inductor. A second inductor has a first terminal coupled to a first unbalanced port and a second terminal coupled to a second unbalanced port. The second inductor is disposed within a first distance of the first inductor to induce magnetic coupling. A second capacitor is coupled between the first and second terminals of the second inductor. A third inductor is disposed within a second distance of the first inductor and within a third distance of the second inductor to induce magnetic coupling. A second capacitor is coupled between first and second terminals of the third inductor.

30 Claims, 8 Drawing Sheets

SEMICONDUCTOR DEVICE HAVING BALANCED BAND-PASS FILTER IMPLEMENTED WITH LC RESONATOR

CLAIM TO DOMESTIC PRIORITY

The present nonprovisional application claims the benefit of priority of U.S. Application Ser. No. 61/017,360, filed Dec. 28, 2007, entitled "Balanced BPF Using LC Resonators" by Kai Liu et al.

FIELD OF THE INVENTION

The present invention relates in general to semiconductor devices and, more particularly, to a semiconductor device having a balanced band-pass filter implemented with LC resonators.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

Baluns and band-pass filters (BPF) are important components in wireless communication systems. Many prior art designs use discrete, cascaded components to achieve both balance and filtering functions. The baluns are implemented as a distributed-line in which size is inversely proportional to the operation frequency. The smaller the operational frequency, the larger the requisite balun. Yet, consumer demand calls for smaller size which makes miniaturization difficult in lower frequency applications, such as GSM cellular.

SUMMARY OF THE INVENTION

A need exists to miniaturize baluns for RF signal processing circuits. Accordingly, in one embodiment, the present invention is a band-pass filter including a plurality of frequency band channels each having a first and second balanced ports and first and second unbalanced ports. Each frequency band channel includes a first inductor having a first terminal coupled to the first balanced port and a second terminal coupled to the second balanced port. A first capacitor is coupled between the first and second terminals of the first inductor. A second inductor has a first terminal coupled to the first unbalanced port and a second terminal coupled to the second unbalanced port. The second inductor is disposed within a first distance of the first inductor to induce magnetic coupling between the first and second inductors. A second capacitor is coupled between the first and second terminals of the second inductor. A third inductor is disposed within a second distance of the first inductor and within a third distance of the second inductor to induce magnetic coupling between the first, second, and third inductors. A third capacitor is coupled between first and second terminals of the third inductor.

In another embodiment, the present invention is a band-pass filter including a plurality of LC resonators each having a first and second balanced ports and first and second unbalanced ports. The band-pass filter comprises a first inductor having a first terminal coupled to the first balanced port and a second terminal coupled to the second balanced port. A first capacitor is coupled between the first and second terminals of the first inductor. A second inductor has a first terminal coupled to the first unbalanced port and a second terminal coupled to the second unbalanced port. A second capacitor is coupled between the first and second terminals of the second inductor. A third inductor is disposed adjacent to the first and second inductors to induce magnetic coupling between the first, second, and third inductors. A third capacitor is coupled between first and second terminals of the third inductor.

In another embodiment, the present invention is an LC resonator circuit comprising a first inductor having first and second terminals. A first capacitor is coupled between the first and second terminals of the first inductor. A second inductor has first and second terminals. A second capacitor is coupled between the first and second terminals of the second inductor. A third inductor is disposed adjacent to the first and second inductors to induce magnetic coupling between the first, second, and third inductors. A third capacitor is coupled between first and second terminals of the third inductor.

In another embodiment, the present invention is an integrated circuit package housing a plurality of LC resonators and having first, second, third, and fourth interconnect terminals. The integrated circuit including a first inductor having a first terminal coupled to the first interconnect terminal and a second terminal coupled to the second interconnect terminal. A first capacitor is coupled between the first and second terminals of the first inductor. A second inductor has a first terminal coupled to the first interconnect terminal and a second terminal coupled to the second interconnect terminal. A second capacitor is coupled between the first and second terminals of the second inductor. A third inductor is disposed adjacent to the first and second inductors to induce magnetic coupling between the first, second, and third inductors. A third capacitor is coupled between first and second terminals of the third inductor.

DETAILED DESCRIPTION OF THE DRAWINGS

Figure 1:
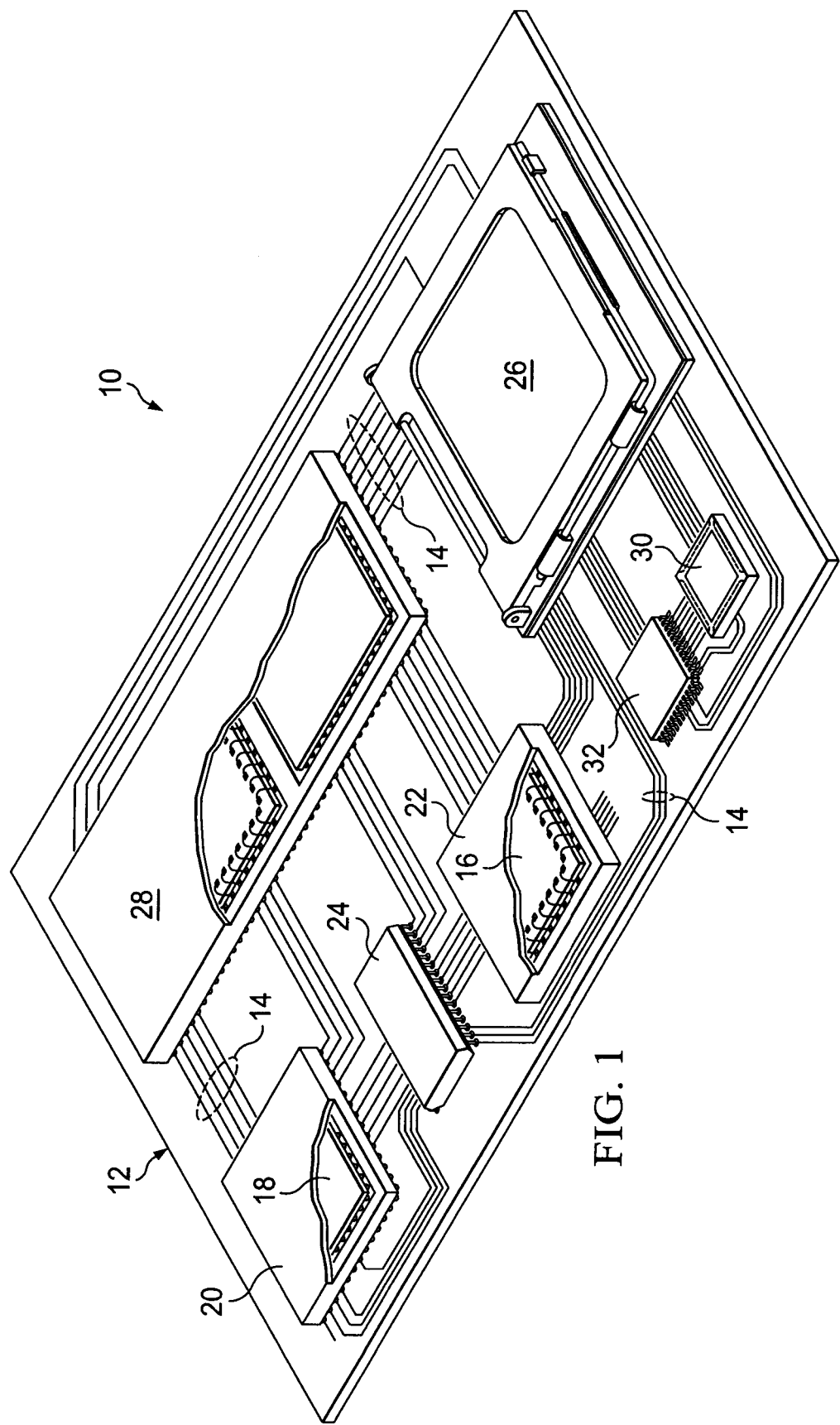
FIG. 1 illustrates a PCB with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
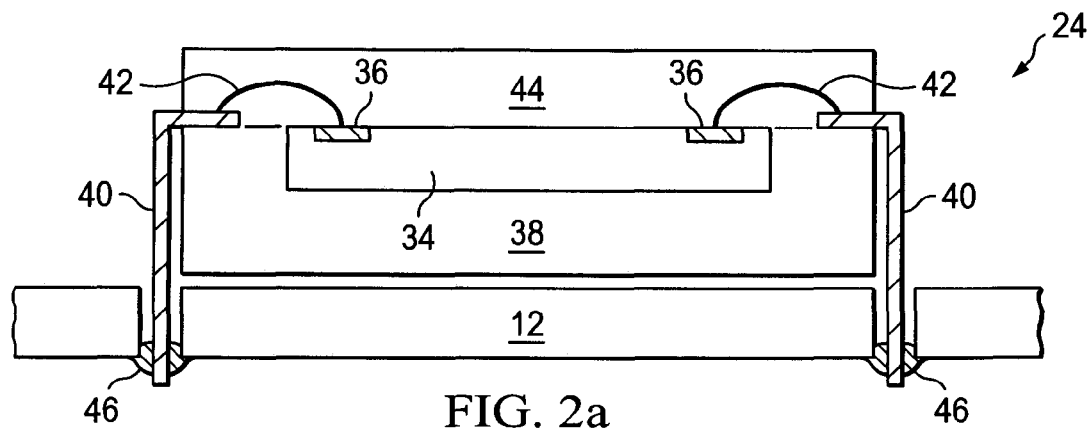
FIGS. 2a-2c illustrate further detail of the semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
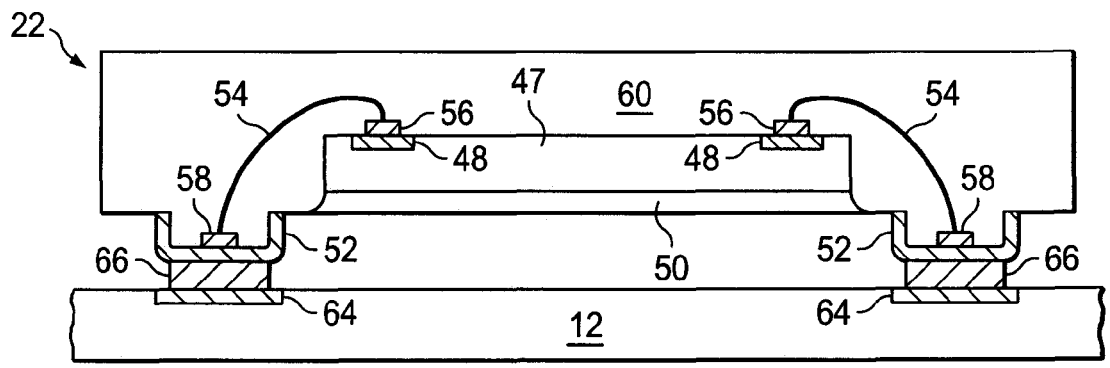

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
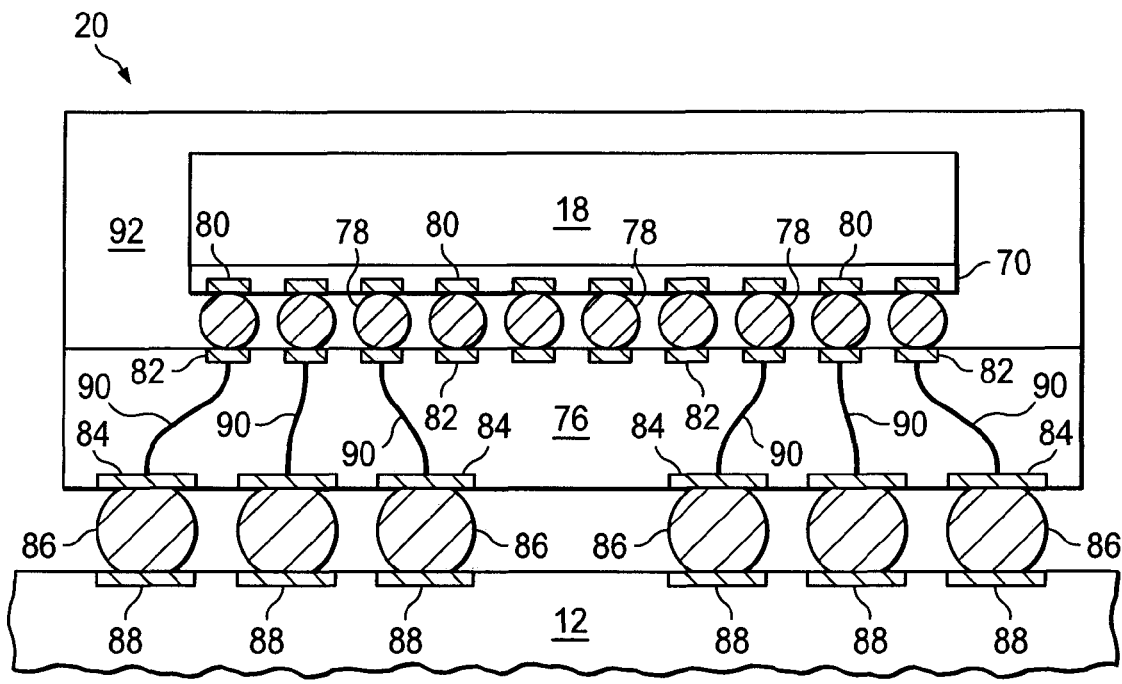

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3:
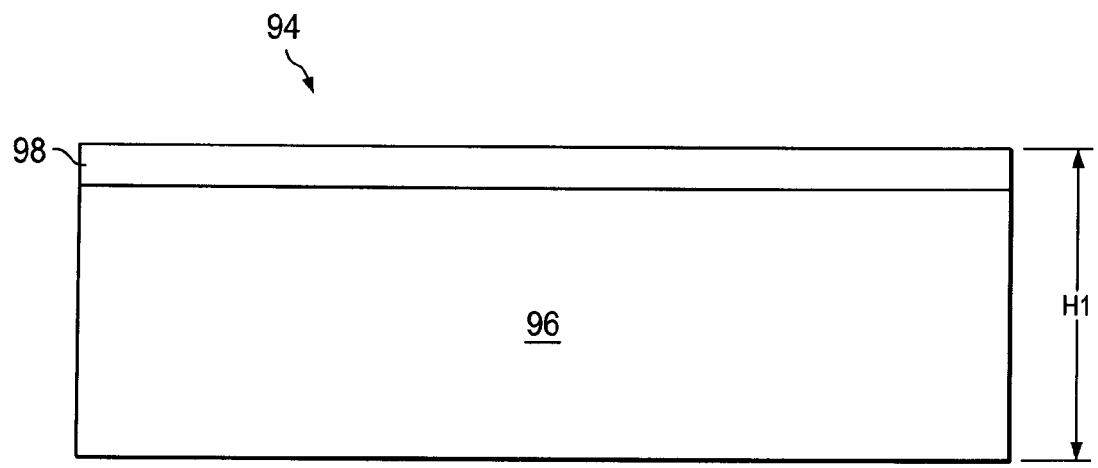
FIG. 3 illustrates a semiconductor package containing an integrated passive device.

Referring to FIG. 3, semiconductor die or package 94 includes a semiconductor substrate 96 which is made of silicon (Si), gallium arsenide (GaAs), glass, or other bulk semiconductor material for structural support. An active region 98 is formed on the top surface of semiconductor substrate 96. Active region 98 includes active devices and integrated passive devices (IPD), conductive layers, and dielectric layers according to the electrical design of the die. The active devices include transistors, diodes, etc. The IPD may include thin film inductors, resistors, and capacitors. Active region 98 occupies about 5-10% of the overall thickness or height H1 of semiconductor die 94. Semiconductor die 94 can be electrically connected to other devices using flipchip, bond wires, or interconnect pins.

Semiconductor devices containing a plurality of IPDs can be used in high frequency applications, such as microwave radar, telecommunications, wireless transceivers, electronic switches, and other devices performing radio frequency (RF) electrical functions. The IPDs provide the electrical characteristics for circuit functions such as baluns (balanced and unbalanced), resonators, high-pass filters, low-pass filters, band-pass filters (BPF), symmetric Hi-Q resonant transformers, matching networks, and tuning capacitors. For example, the IPDs can be used as front-end wireless RF components, which can be positioned between the antenna and transceiver. The wireless application can be a cellular phone using multiple band operation, such as wideband code division multiple access (WCDMA) bands (PCS, IMT, low) and global system mobile communication (GSM) bands (low and high).

The balun is often used to change impedance and minimize common-mode noise through electromagnetic coupling. In some applications, multiple baluns are formed on a same substrate, allowing multi-band operation. For example, two or more baluns are used in a quad-band for mobile phones or other GSM communications, each balun dedicated for a frequency band of operation of the quad-band device. A typical RF system requires multiple IPDs and other high frequency circuits in one or more semiconductor packages to perform the necessary electrical functions.

Figure 4:
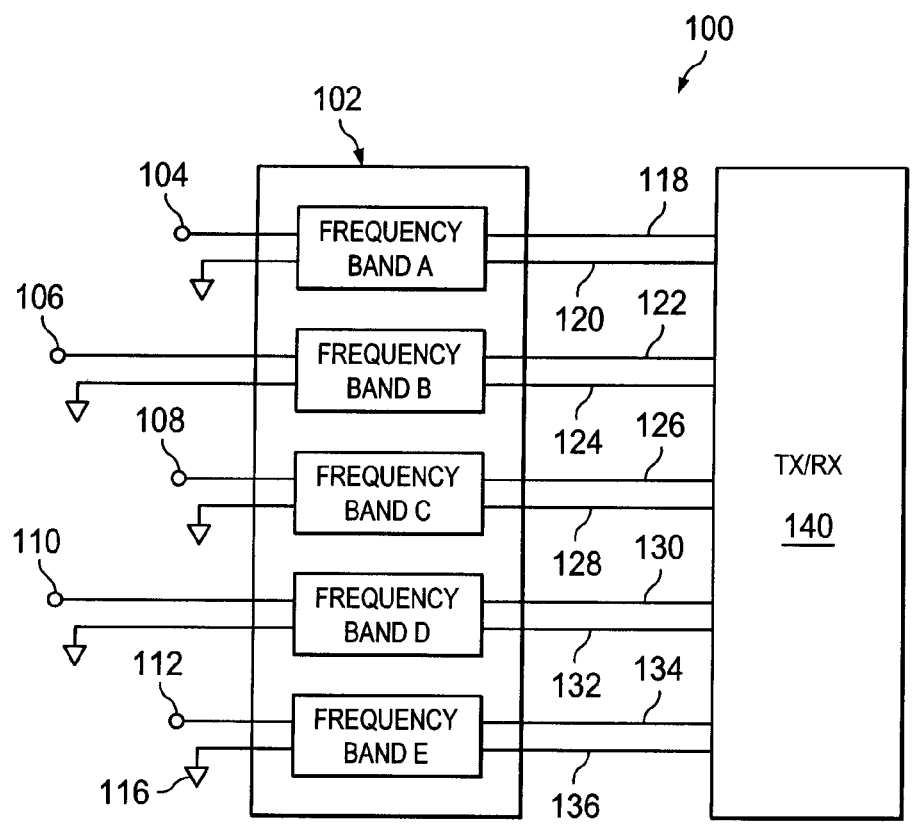
FIG. 4 illustrates a multi-channel RF signal processing circuit coupled to a transceiver.

FIG. 4 shows a wireless communication system 100 using an RF integrated circuit (RFIC) 102. The RFIC 102 performs BPF signal processing for RF signals in five distinct frequency band processing channels: frequency band A, frequency band B, frequency band C, frequency band D, and frequency band E. Frequency band A has an unbalanced port or terminal 104; frequency band B has an unbalanced port or terminal 106; frequency band C has an unbalanced port or terminal 108; frequency band D has an unbalanced port or terminal 110; frequency band E has an unbalanced port or terminal 112. Ground terminal 116 is the return path for the unbalanced ports 104-112 in frequency bands A-E. Frequency band A has balanced ports or terminals 118 and 120; frequency band B has balanced ports or terminals 122 and 124; frequency band C has balanced ports or terminals 126 and 128; frequency band D has balanced ports or terminals 130 and 132; frequency band E has balanced ports or terminals 134 and 136. Balanced ports 118-136 are respectively coupled to transceiver 140 for further transmitter and receiver signal processing. The wireless RF components use multiple bands to increase functionality and services. For example, frequency bands A-C process WCDMA and frequency band D-E process GSM. RFIC 102 uses baluns in each frequency band A-E to transform impedance and minimize common-mode noise.

Figure 5:
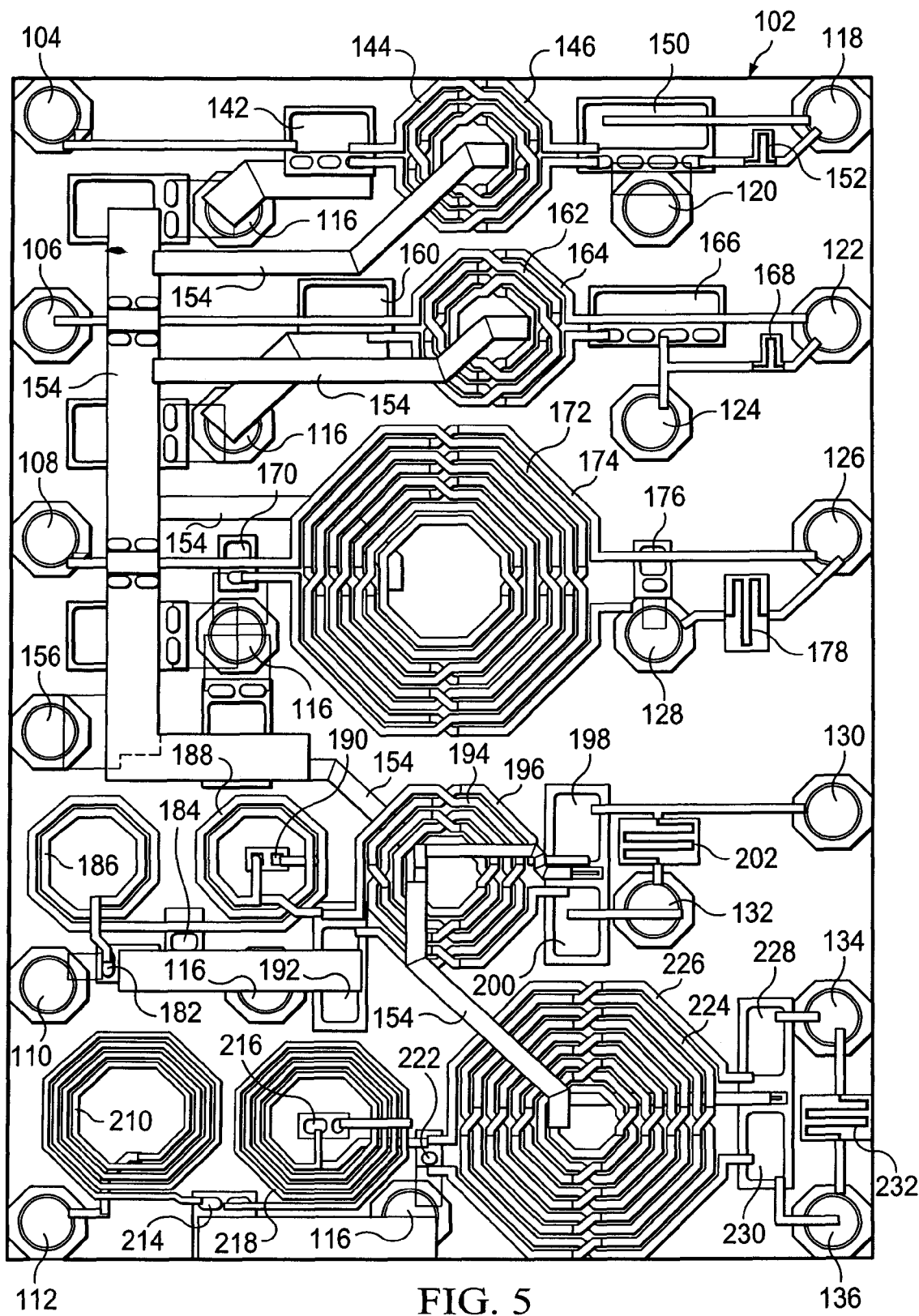
FIG. 5 illustrates a layout of the multi-channel RF signal processing circuit.
Figure 6A:
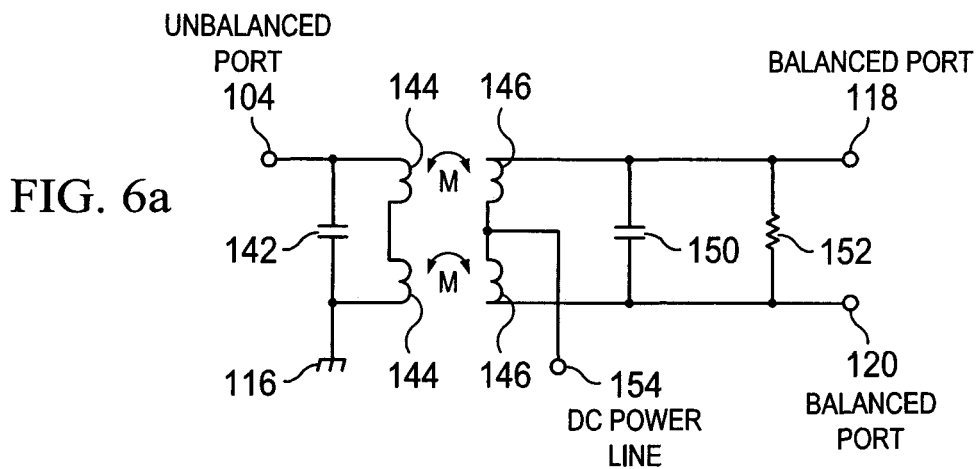
FIGS. 6a-6c are schematic diagrams of individual RF signal processing channels.

FIG. 5 shows further layout detail of RFIC 102 with frequency band A-E processing channels. In one embodiment, RFIC 102 occupies an area 3.2 millimeters (mm) by 2.2 mm. FIG. 6a shows an equivalent schematic circuit diagram corresponding to frequency band A including unbalanced port 104, ground terminal 116, and capacitor 142 and inductor 144 coupled between unbalanced port 104 and ground terminal 116. An inductor 146, capacitor 150, and resistor 152 are coupled between balanced ports 118 and 120. Resistor 152 provides a flat pass-band response. A direct current (DC) power bus 154 is coupled to a center point of inductor 146. DC power bus 154 is common to all connected devices. The DC power is applied at terminal 156. Due to the close spacing and interleaving layout, a mutual inductance or magnetic coupling is induced between inductors 144 and 146. Accordingly, inductors 144-146 operate as part of a balun in a BPF arrangement in frequency band A.

Frequency band B is configured similar to FIG. 6a including unbalanced port 106, ground terminal 116, and capacitor 160 and inductor 162 coupled between unbalanced port 106 and ground terminal 116. An inductor 164, capacitor 166, and resistor 168 are coupled between balanced ports 122 and 124. Resistor 168 provides a flat pass-band response. DC power bus 154 is coupled to a center point of inductor 164. Due to the close spacing and interleaving layout, a mutual inductance or magnetic coupling is induced between inductors 162 and 164. Accordingly, inductors 162-164 operate as part of a balun in a BPF arrangement in frequency band B.

Frequency band C is configured similar to FIG. 6a including unbalanced port 108, ground terminal 116, and capacitor 170 and inductor 172 coupled between unbalanced port 108 and ground terminal 116. An inductor 174, capacitor 176, and resistor 178 are coupled between balanced ports 126 and 128. Resistor 178 provides a flat pass-band response. DC power bus 154 is coupled to a center point of inductor 174. Due to the close spacing and interleaving layout, a mutual inductance or magnetic coupling is induced between inductors 172 and 174. Accordingly, inductors 172-174 operate as part of a balun in a BPF arrangement in frequency band C.

Figure 6B:
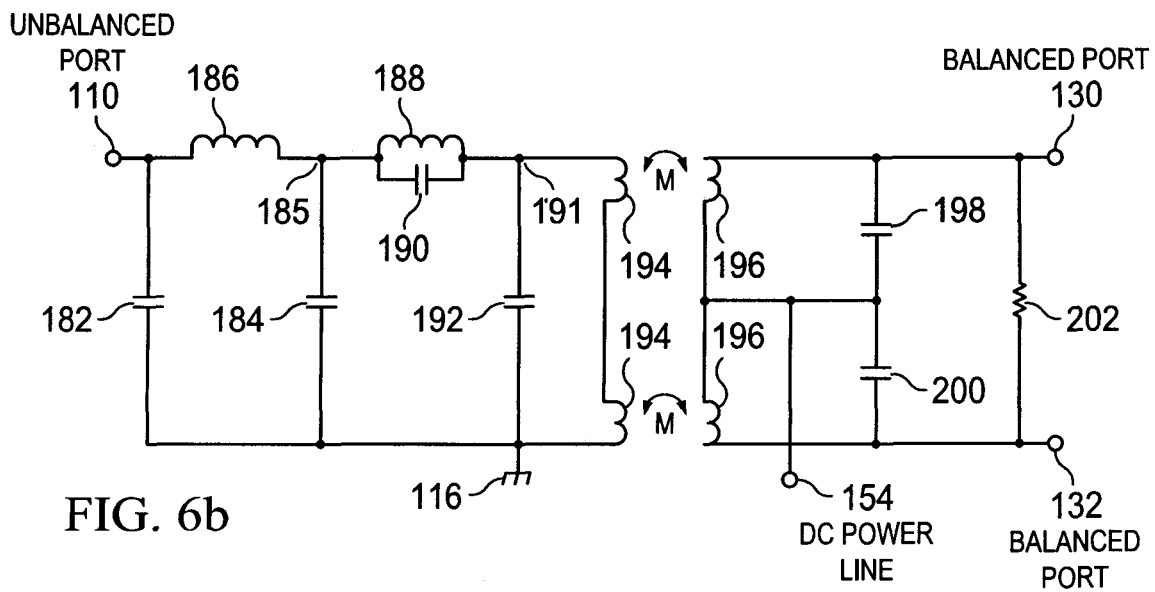

Frequency band D is configured as shown in FIG. 6b including unbalanced port 110, ground terminal 116, and capacitor 182 coupled between unbalanced port 110 and ground terminal 116. An inductor 186 is coupled between unbalanced port 110 and node 185. Capacitor 184 is coupled between node 185 and ground terminal 116. A parallel combination of inductor 188 and capacitor 190 is coupled between node 185 and node 191. Capacitor 192 and inductor 194 are coupled between node 191 and ground terminal 116. Capacitors 182, 184, 190, and 192, and inductors 186 and 188 operate as a low-pass filter. An inductor 196 is coupled between balanced ports 130 and 132. A series combination of capacitors 198 and 200 is coupled between balanced ports 130 and 132. A resistor 202 is coupled between balanced ports 130 and 132. Resistor 202 provides a flat pass-band response. DC power bus 154 is coupled to a center point of inductor 196 and the junction between capacitors 198 and 200. Due to the close spacing and interleaving layout, a mutual inductance or magnetic coupling is induced between inductors 194 and 196. Accordingly, inductors 194-196 operate as part of a balun in a BPF arrangement in frequency band D.

Figure 6C:
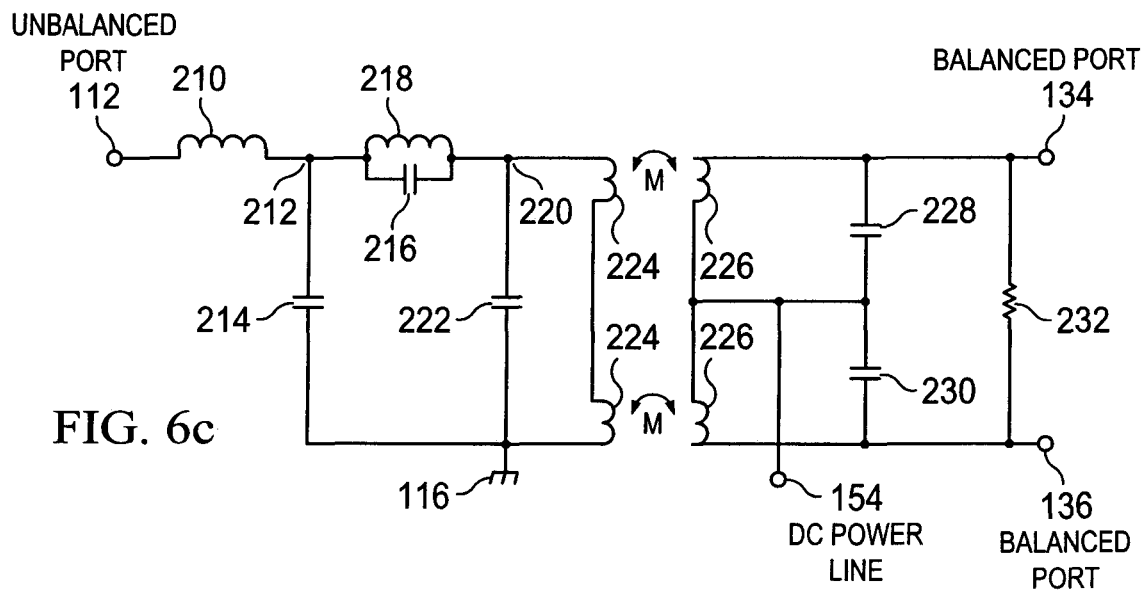

Frequency band E is configured as shown in FIG. 6c including unbalanced port 112, ground terminal 116, and inductor 210 coupled between unbalanced port 112 and node 212. A capacitor 214 is coupled between node 212 and ground terminal 116. A parallel combination of capacitor 216 and inductor 218 is coupled between node 212 and node 220. A capacitor 222 and inductor 224 are coupled between node 220 and ground terminal 116. Capacitors 214, 216, and 222, and inductors 210 and 218 operate as a low-pass filter. An inductor 226 is coupled between balanced ports 134 and 136. A series combination of capacitors 228 and 230 is coupled between balanced ports 134 and 136. A resistor 232 is coupled between balanced ports 134 and 136. Resistor 232 provides a flat pass-band response. DC power bus 154 is coupled to a center point of inductor 226 and the junction between capacitors 228 and 230. Due to the close spacing and interleaving layout, a mutual inductance or magnetic coupling is induced between inductors 224 and 226. Accordingly, inductors 224-226 operate as part of a balun in a BPF arrangement in frequency band E.

Figure 7:
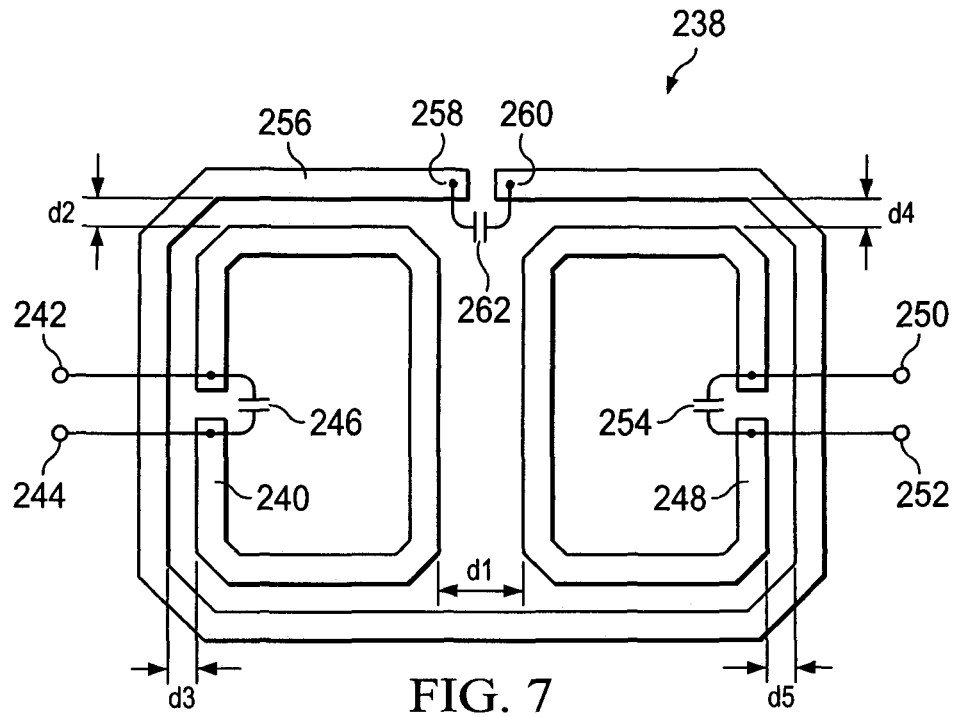
FIG. 7 illustrates a plurality of LC resonators for use in an RF signal processing channel.

An alternate embodiment of the balun used in RFIC 102 is shown in FIG. 7. Balun 238 is implemented using LC (inductor and capacitor) resonators which can be integrated on substrate 96 in FIG. 3. In this case, balun 238 is coupled between the unbalanced ports and balanced ports in RFIC 102. An inductor 240 includes first and second end terminals coupled to unbalanced ports 242 and 244. In one embodiment, port 242 is a single-ended unbalanced port and port 244 is a ground terminal. Alternatively, port 244 is a single-ended unbalanced port and port 242 is the ground terminal. A capacitor 246 is coupled between unbalanced ports 242 and 244. The inductor 240 and capacitor 246 constitute a first LC resonator. An inductor 248 includes first and second end terminals coupled to balanced ports 250 and 252. A capacitor 254 is coupled between balanced ports 250 and 252. The inductor 248 and capacitor 254 constitute a second LC resonator. The inductor 240 is disposed a distance d1 from inductor 248. An inductor 256 includes end terminals 258 and 260. A capacitor 262 is coupled in series between end terminals 258 and 260 of inductor 256. The inductor 256 and capacitor 262 constitute a third LC resonator. Inductor 256 is disposed around a perimeter of inductors 240 and 248 non-overlapping with planar separations of d2, d3, d4, and d5. Inductor 256 can have a larger, smaller, or symmetrical value with inductors 240 and 248.

The circuit layout shown in FIG. 7 is implemented in RFIC 102 and provides balun and filter functions, i.e., a balanced filter, in a small form factor. The circuit contains three LC resonators using mutual inductance or magnetic inductive coupling. The inductors 240, 248, and 256 can have a rectangular, polygonal, or circular form or shape and are wound to create magnetic coupling. Capacitors 246 and 254 provide electrostatic discharge (ESD) protection for the balun. The inductors 240, 248, and 256 are implemented using 8 μm conductive material such as Al, Cu, Sn, Ni, Au, or Ag. Capacitors 246, 254, and 262 are implemented using a thin film dielectric. The thin film material increases capacitance density. The ESD robustness in thin-film materials can be obtained by using inductive shunt protection across vulnerable capacitors. Most of the energy in an ESD event is concentrated at low frequency, for which inductors in the nano-Henry range are effectively short circuits. In the magnetically-coupled circuit, each capacitor is protected by a low-value shunt inductor to increase robustness to ESD.

The mutual inductance or magnetic coupling strength between inductors 240 and 248 is determined by the distance d1 between two coils. Likewise, the magnetic coupling strength between inductors 240 and 256, and between inductor 248 and 256, is determined by the distance d2, d3, d4, and d5 between two coils. In one embodiment, the distances d1-d5 are set to 10 μm. The BPF parameters are selected by adjusting the separation between capacitively-loaded inductive rings to tune the magnetic coupling. Capacitors 246, 254, and 262 are tuned to match the impedance for the requisite application.

The unbalanced port 242 and 244 and balanced ports 250 and 252 do not share a common DC reference. Each input and output can operate single-ended or differential. There is no need for a separate balun transformer in applications requiring balanced-to-unbalanced conversion.

Figure 8:
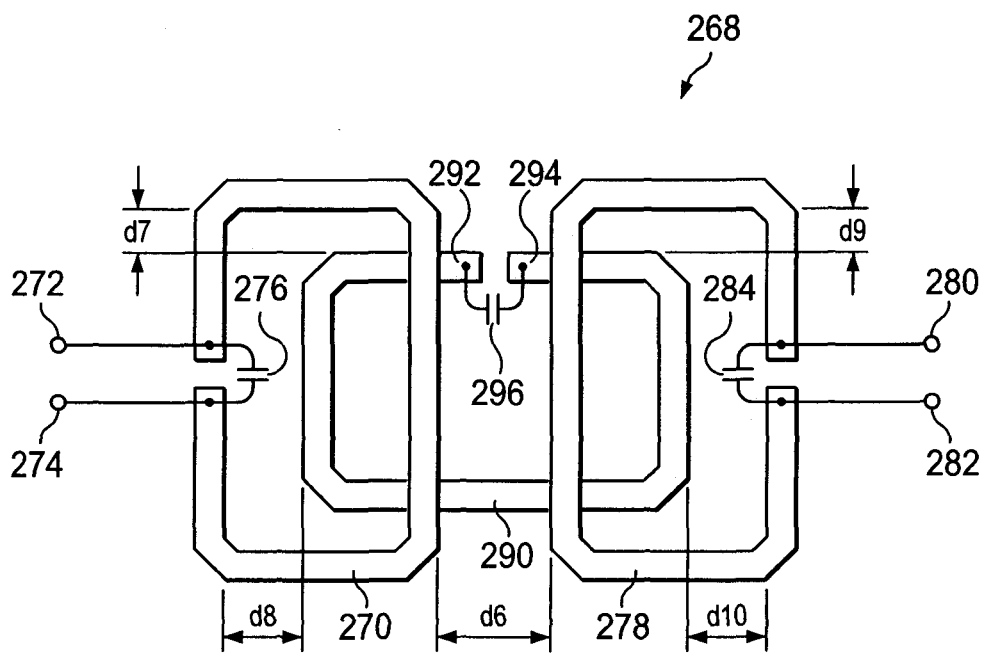
FIG. 8 illustrates another embodiment of the LC resonators for use in an RF signal processing channel.

Another embodiment of the balun used in RFIC 102 is shown in FIG. 8. Balun 268 is implemented using LC resonators which can be integrated on substrate 96 in FIG. 3. In this case, balun 268 is coupled between the unbalanced ports and balanced ports in RFIC 102. An inductor 270 includes first and second end terminals coupled to unbalanced ports 272 and 274. In one embodiment, port 272 is a single-ended unbalanced port and port 274 is a ground terminal. Alternatively, port 274 is the single-ended unbalanced port and port 272 is the ground terminal. A capacitor 276 is coupled between unbalanced ports 272 and 274. The inductor 270 and capacitor 276 constitute a first LC resonator. An inductor 278 includes first and second end terminals coupled to balanced ports 280 and 282. A capacitor 284 is coupled between balanced ports 280 and 282. The inductor 278 and capacitor 284 constitute a second LC resonator. The inductor 270 is disposed a distance d6 from inductor 278. An inductor 290 includes end terminals 292 and 294. A capacitor 296 is coupled in series between end terminals 292 and 294 of inductor 290. The inductor 290 and capacitor 296 constitute a third LC resonator. The inductor 290 overlays inductors 270 and 278 with vertical electrical isolation and has planar separations of d7, d8, d9, and d10. Inductor 290 can have a larger, smaller, or symmetrical value with inductors 270 and 278.

The circuit layout shown in FIG. 8 is implemented as an RFIC and provides balun and filter functions, i.e., a balanced filter, in a small form factor. The circuit contains three LC resonators using mutual inductance or magnetic inductive coupling. The inductors 270, 278, and 290 can have a rectangular, polygonal, or circular form or shape and are wound to create magnetic coupling. Capacitors 276 and 284 provide ESD protection for the balun. The inductors 270, 278, and 290 are implemented using 8 µm conductive material such as Al, Cu, Sn, Ni, Au, or Ag. Capacitors 276, 284, and 296 are implemented using a thin film dielectric. The thin film material increases capacitance density. The ESD robustness in thin-film material can be obtained by using inductive shunt protection across vulnerable capacitors. Most of the energy in an ESD event is concentrated at low frequency, for which inductors in the nano-Henry range are effectively short circuits. In the magnetically-coupled circuit, each capacitor is protected by a low-value shunt inductor to increase robustness to ESD.

The mutual inductance or magnetic coupling strength between inductors 270 and 278 is determined by the distance d6 between two coils. Likewise, the magnetic coupling strength between inductors 270 and 290, and between inductor 278 and 290, is determined by the distances d7, d8, d9, and d10 between two coils. In one embodiment, the distances d6-d10 are set to 10 µm. The BPF parameters are selected by adjusting the separation between capacitively-loaded inductive rings to tune the magnetic coupling. Capacitors 276, 284, and 296 are tuned to match the impedance for the requisite application.

The unbalanced ports 272 and 274 and balanced ports 280 and 282 do not share a common DC reference. Each input and output can operate single-ended or differential. There is no need for a separate balun transformer in applications requiring balanced-to-unbalanced conversion.

Figure 9:
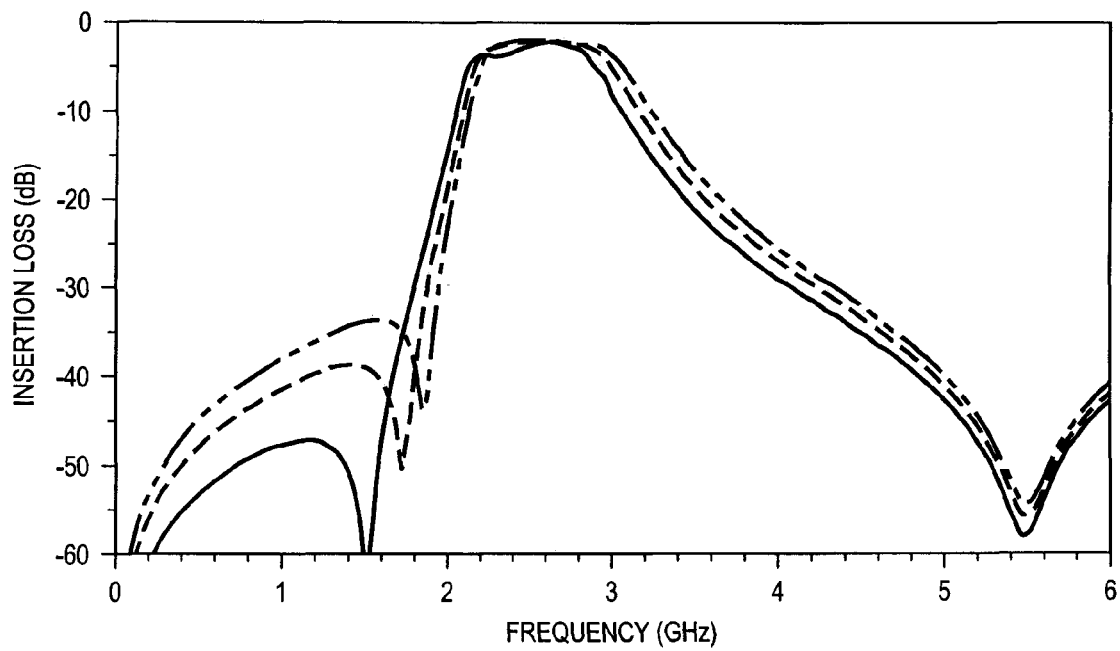
FIG. 9 is a graph of insertion loss versus frequency for different distances d1 between inductors of the LC resonator.
Figure 10:
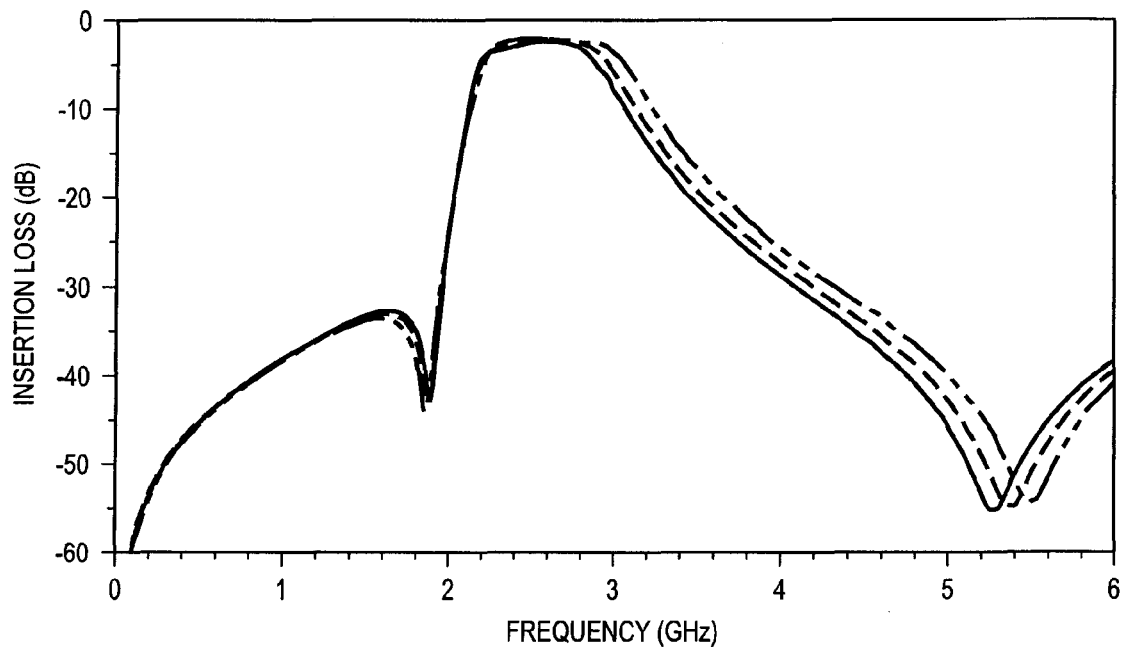
FIG. 10 is a graph of insertion loss versus frequency for different distances d2 between inductors of the LC resonator.
Figure 11:
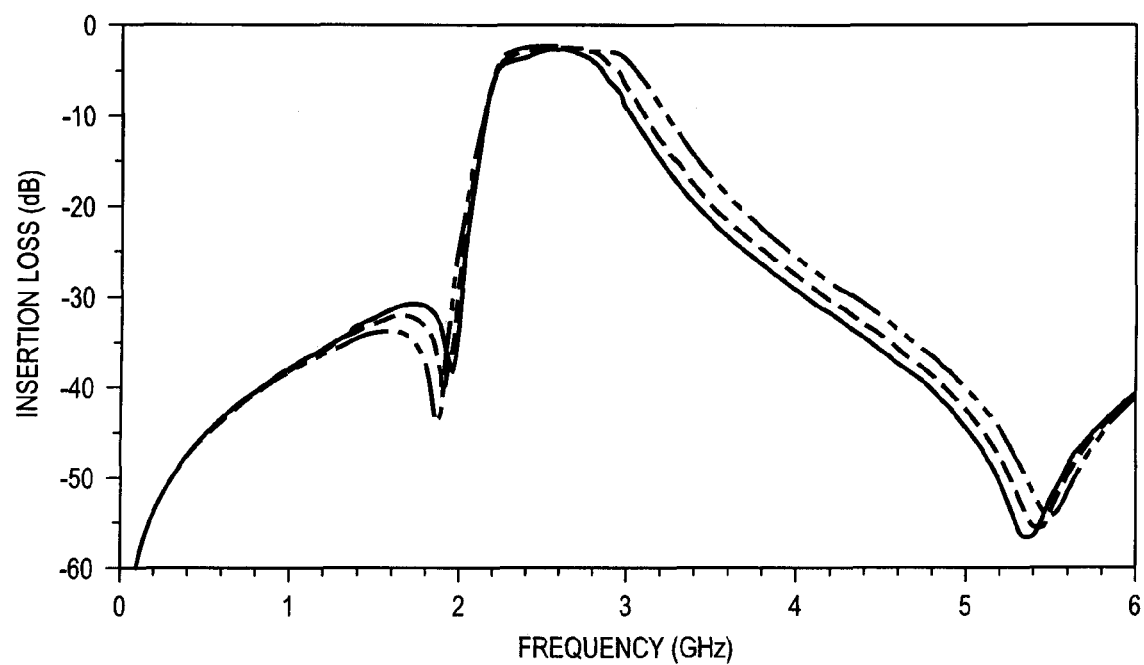
FIG. 11 is a graph of insertion loss versus frequency for different distances d3 between inductors of the LC resonator.

FIG. 9 is a graph of insertion loss versus frequency for balun 238 for different values of d1. FIG. 10 is a graph of insertion loss versus frequency for balun 238 for different values of d2. FIG. 11 is a graph of insertion loss versus frequency for balun 238 for different values of d3.

While one or more embodiments of the present invention have been illustrated in detail, the skilled artisan will appreciate that modifications and adaptations to those embodiments may be made without departing from the scope of the present invention as set forth in the following claims.

What is claimed is:

1. A band-pass filter including a plurality of frequency band channels each having first and second balanced ports and first and second unbalanced ports, each frequency band channel comprising:
   a first split-ring resonator having a first end terminal coupled to the first balanced port and a second end terminal coupled to the second balanced port, the first end terminal and the second end terminal of the first split-ring resonator defining a first gap in the first split-ring resonator;
   a first capacitor coupled between the first and second end terminals of the first split-ring resonator;
   a second split-ring resonator having a first end terminal coupled to the first unbalanced port and a second end terminal coupled to the second unbalanced port, the second split-ring resonator being disposed within a first distance of the first split-ring resonator to induce magnetic coupling between the first and second split-ring resonators, the first end terminal and the second end terminal of the second split-ring resonator defining a second gap in the second split-ring resonator;
   a second capacitor coupled between the first and second end terminals of the second split-ring resonator;
   a third split-ring resonator disposed within a second distance of the first split-ring resonator and within a third distance of the second split-ring resonator to induce magnetic coupling between the first, second, and third split-ring resonators; and
   a third capacitor coupled between a first end terminal and a second end terminal of the third split-ring resonator, the first end terminal and the second end terminal of the third split-ring resonator defining a third gap in the third split-ring resonator, wherein the third gap is disposed relative to the first and second gaps such that a first vertical plane that passes through both the first and second gaps is substantially perpendicular to a second vertical plane that passes through the third gap, and wherein the first split-ring resonator is substantially symmetric to the second split-ring resonator about the second vertical plane.

2. The band-pass filter of claim 1, wherein the first, second, and third split-ring resonators are thin film conductive material, and the first, second, and third capacitors are thin film dielectric.

3. The band-pass filter of claim 1, wherein the first, second, and third split-ring resonators have rectangular, polygonal, or circular shape.

4. The band-pass filter of claim 1, wherein the first and second split-ring resonators are substantially coplanar and overlay the third split-ring resonator.

5. The band-pass filter of claim 1, wherein the first split-ring resonator is disposed adjacent and non-overlapping with the second split-ring resonator, and the third split-ring resonator is disposed around a perimeter and non-overlapping with the first and second split-ring resonators.

6. The band-pass filter of claim 1, further including a substrate, wherein the first, second, and third split-ring resonators and first, second, and third capacitors are integrated on the substrate.

7. A band-pass filter including a plurality of frequency band channels each having first and second balanced ports and first and second unbalanced ports, each frequency band channel, comprising:
   a first inductor having a first end terminal coupled to the first balanced port and a second end terminal coupled to the second balanced port, the first end terminal and second end terminal of the first inductor separated by a first gap;
   a first capacitor coupled between the first and second end terminals of the first inductor;
   a second inductor having a first portion alongside a first portion of the first inductor, a first end terminal coupled to the first unbalanced port, and a second end terminal coupled to the second unbalanced port, the first end terminal and second end terminal of the second inductor separated by a second gap;

a second capacitor coupled between the first and second end terminals of the second inductor;

a third inductor having a first portion alongside a second portion of the first inductor, a second portion alongside a second portion of the second inductor, and a first end terminal and a second end terminal that are separated by a third gap, the third inductor disposed adjacent to the first and second inductors to induce magnetic coupling between the first, second, and third inductors, and wherein the third gap is disposed relative to the first and second gaps such that a first vertical plane that passes through both the first and second gaps is substantially perpendicular to a second vertical plane that passes through the third gap; and a third capacitor coupled between the first and second end terminals of the third inductor.

8. The band-pass filter of claim 7, further including a substrate, wherein the first, second, and third inductors and first, second, and third capacitors are integrated on the substrate.

9. The band-pass filter of claim 8, wherein the second inductor is disposed within a first distance of the first inductor to induce magnetic coupling between the first and second inductors.

10. The band-pass filter of claim 8, wherein the third inductor is disposed within a second distance of the first inductor and within a third distance of the second inductor to induce magnetic coupling between the first, second, and third inductors.

11. The band-pass filter of claim 8, wherein the first, second, and third inductors are thin film conductive material, and the first, second, and third capacitors are thin film dielectric.

12. The band-pass filter of claim 7, wherein the first and second inductors are substantially coplanar and overlay the third inductor.

13. The band-pass filter of claim 7, wherein the first inductor is disposed adjacent and non-overlapping with the second inductor, and the third inductor is disposed around a perimeter and non-overlapping with the first and second inductors.

14. An LC resonator circuit having first, second, third, and fourth interconnect terminals, the LC resonator circuit, comprising:
   a first inductor having first and second end terminals, the first and second end terminals of the first inductor coupled to the first and second interconnect terminals, respectively;
   a first capacitor coupled between the first and second end terminals of the first inductor;
   a second inductor having first and second end terminals and a first portion alongside a first portion of the first inductor, the first and second end terminals of the second inductor coupled to the third and fourth interconnect terminals, respectively;
   a second capacitor coupled between the first and second end terminals of the second inductor;
   a third inductor having first and second end terminals, a first portion alongside a second portion of the first inductor, and a second portion alongside a second portion of the second inductor, the third inductor disposed adjacent to the first and second inductors to induce magnetic coupling between the first, second, and third inductors; and
   a third capacitor coupled between the first and second end terminals of the third inductor.

15. The LC resonator circuit of claim 14, wherein the first inductor is disposed adjacent and non-overlapping with the second inductor, and the third inductor is disposed around a perimeter and non-overlapping with the first and second inductors.

16. An LC resonator circuit having first, second, third, and fourth interconnect terminals, the LC resonator circuit, comprising:
   a first inductor having first and second end terminals, the first and second end terminals of the first inductor coupled to the first and second interconnect terminals, respectively;
   a first capacitor coupled between the first and second end terminals of the first inductor;
   a second inductor having first and second end terminals, the first and second end terminals of the second inductor coupled to the third and fourth interconnect terminals, respectively;
   a second capacitor coupled between the first and second end terminals of the second inductor;
   a third inductor having first and second end terminals, the third inductor disposed adjacent to the first and second inductors to induce magnetic coupling between the first, second, and third inductors; and
   a third capacitor coupled between the first and second end terminals of the third inductor;
   wherein the first and second inductors are substantially coplanar and overlay the third inductor.

17. The LC resonator circuit of claim 16, wherein the third inductor is disposed within a second distance of the first inductor and within a third distance of the second inductor to induce magnetic coupling between the first, second, and third inductors.

18. The LC resonator circuit of claim 16, wherein the second inductor is disposed within a first distance of the first inductor to induce magnetic coupling between the first and second inductors.

19. The LC resonator circuit of claim 16, further including a substrate, wherein the first, second, and third inductors and first, second, and third capacitors are integrated on the substrate.

20. An integrated circuit package housing a plurality of LC resonators and having first, second, third, and fourth interconnect terminals, comprising:
   a first inductor having a first end terminal coupled to the first interconnect terminal and a second end terminal coupled to the second interconnect terminal, the first and second end terminals of the first inductor separated by a first gap;
   a first capacitor coupled between the first and second end terminals of the first inductor;
   a second inductor having a first portion alongside a first portion of the first inductor, a first end terminal coupled to the third interconnect terminal, and a second end terminal coupled to the fourth interconnect terminal, the first and second end terminals of the second inductor separated by a second gap;
   a second capacitor coupled between the first and second end terminals of the second inductor;
   a third inductor disposed adjacent to the first and second inductors to induce magnetic coupling between the first, second, and third inductors and having a first portion alongside a second portion of the first inductor and second portion alongside a second portion of the second inductor; and
   a third capacitor coupled between first and second end terminals of the third inductor, the first and second end terminals of the third inductor separated by a third gap.

21. The integrated circuit of claim 20, wherein the first inductor is disposed adjacent and non-overlapping with the second inductor, and the third inductor is disposed around a perimeter and non-overlapping with the first and second inductors.

22. An integrated circuit package housing a plurality of LC resonators and having first, second, third, and fourth interconnect terminals, comprising:
- a first inductor having a first end terminal coupled to the first interconnect terminal and a second end terminal coupled to the second interconnect terminal, the first and second end terminals of the first inductor separated by a first gap;
- a first capacitor coupled between the first and second end terminals of the first inductor;
- a second inductor having a first end terminal coupled to the third interconnect terminal and a second end terminal coupled to the fourth interconnect terminal, the first and second end terminals of the second inductor separated by a second gap;
- a second capacitor coupled between the first and second end terminals of the second inductor;
- a third inductor disposed adjacent to the first and second inductors to induce magnetic coupling between the first, second, and third inductors; and
- a third capacitor coupled between first and second end terminals of the third inductor, the first and second end terminals of the third inductor separated by a third gap;
- wherein the first and second inductors are substantially coplanar and overlay the third inductor.

23. The integrated circuit of claim 22, wherein the third inductor is disposed within a second distance of the first inductor and within a third distance of the second inductor to induce magnetic coupling between the first, second, and third inductors.

24. The integrated circuit of claim 22, wherein the second inductor is disposed within a first distance of the first inductor to induce magnetic coupling between the first and second inductors.

25. An LC resonator circuit, comprising:
- a first inductor;
- a second inductor having a first portion alongside a first portion of the first inductor;
- a third inductor having a first portion alongside a second portion of the first inductor and second portion alongside a second portion of the second inductor;
- a first capacitor electrically coupled between first and second terminals of the first inductor;
- a second capacitor electrically coupled between first and second terminals of the second inductor; and
- a third capacitor electrically coupled between first and second terminals of the third inductor.

26. The LC resonator circuit of claim 25, further including the LC resonator circuit integrated on a substrate.

27. The LC resonator circuit of claim 25, further including the first inductor disposed substantially coplanar with the second inductor and overlaying the third inductor.

28. The LC resonator circuit of claim 25, further including the third inductor disposed substantially coplanar with the first and second inductors.

29. The LC resonator circuit of claim 25, further including the third inductor disposed around a perimeter of the first and second inductors.

30. The LC resonator circuit of claim 25, further including the first, second, and third inductors magnetically coupled to each other.

* * * * *